US012587167B2

(12) United States Patent     (10) Patent No.:   US 12,587,167 B2
Ikeuchi     (45) Date of Patent:    Mar. 24, 2026

(54) HIGH QUALITY FACTOR SAW RESONATORS WITH SHARED REFLECTOR

(71) Applicant: SKYWORKS SOLUTIONS, INC., Irvine, CA (US)

(72) Inventor: Satoru Ikeuchi, Ashiya (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 141 days.

(21) Appl. No.: 18/422,661

(22) Filed: Jan. 25, 2024

(65) Prior Publication Data

US 2024/0267030 A1     Aug. 8, 2024

Related U.S. Application Data

(60) Provisional application No. 63/482,912, filed on Feb. 2, 2023.

(51) Int. Cl.
| *H03H 9/64* | (2006.01) |
| *H03H 9/145* | (2006.01) |
| *H03H 9/25* | (2006.01) |

(52) U.S. Cl.
CPC .............. _H03H 9/64_ (2013.01); _H03H 9/145_ (2013.01); _H03H 9/25_ (2013.01)

(58) Field of Classification Search
CPC .. H03H 9/25; H03H 9/14582; H03H 9/14541; H03H 9/6436; H03H 9/6483; H03H 9/725; H03H 9/02834; H03H 9/0038; H03H 9/02574; H03H 9/02858; H03H 9/02881; H03H 9/0042; H03H 9/0061; H03H 9/02992; H03H 9/145; H03H 9/02559; H03H 9/1457; H03H 9/14588; H03H 9/64; H03H 9/6406; H01L 2924/15174

See application file for complete search history.

(56) References Cited

U.S. PATENT DOCUMENTS

| 5,363,073 A | * | 11/1994 | Higgins | ............... | H03H 9/6433 |
| | | | | | 333/195 |
| 6,972,643 B2 | * | 12/2005 | Tsunekawa | .......... | H03H 9/0042 |
| | | | | | 333/195 |
| 2022/0360252 A1 | * | 11/2022 | Nakamura | ......... | H03H 9/14541 |

* cited by examiner

*Primary Examiner* — Lincoln D Donovan
*Assistant Examiner* — Tyler J Pereny
(74) *Attorney, Agent, or Firm* — Lando & Anastasi, LLP

(57) ABSTRACT

Aspects and embodiments disclosed herein include an acoustic wave device comprising a first pair of IDT electrodes disposed on a substrate, fingers of the first pair of IDT electrodes separated by a first pitch distance from adjacent fingers, a second pair of IDT electrodes disposed on the substrate, fingers of the second pair of IDT electrodes separated by a second pitch distance from adjacent fingers, and a common reflector disposed between the first pair of IDT electrodes and the second pair of IDT electrodes, the common reflector including a plurality of fingers separated from each other by a third pitch distance, which is greater than the first pitch distance and is equal to or smaller than the second pitch distance.

9 Claims, 15 Drawing Sheets

| ELEMENT | NUM OF FINGER | PITCH |
|---------|---------------|-------|
| Ref1 | 25 | 1.65 |
| IDT1 | 100 | 1.6 |
| Ref2 | 10 | 1.65 |
| IDT2 | 100 | 1.65 |
| Ref3 | 25 | 1.65 |

HIGH QUALITY FACTOR SAW RESONATORS WITH SHARED REFLECTOR

CROSS-REFERENCE TO RELATED APPLICATIONS

This application claims priority under 35 U.S.C. § 119 (e) to U.S. Provisional Patent Application Ser. No. 63/482,912, titled "HIGH QUALITY FACTOR SAW RESONATORS WITH SHARED REFLECTOR," filed Feb. 2, 2023, the entire content of which is incorporated herein by reference for all purposes.

BACKGROUND

Field

Aspects and embodiments disclosed herein relate to electronic systems, and in particular, to a filter for use in radio frequency (RF) electronics.

Description of the Related Technology

Filters are used in radio frequency (RF) communication systems to allow signals to pass through at discreet frequencies but reject any frequency outside of the specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic wave resonator (FBAR) filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter modules include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In accordance with one aspect, there is provide an acoustic wave device. The acoustic wave device comprises a substrate, a first pair of IDT electrodes disposed on the substrate, each of the first pair of IDT electrodes including a bus bar and a plurality of fingers extending along a surface of the substrate from the bus bar, a respective finger of one IDT electrode arranged interleaved with respective fingers of the other IDT electrode of the first pair of IDT electrodes, the respective finger of the first pair of IDT electrodes separated by a first pitch distance from an adjacent finger, a second pair of IDT electrodes disposed on the substrate, each of the second pair of IDT electrodes including a bus bar and a plurality of fingers extending along the surface of the substrate from the bus bar, a respective finger of one IDT electrode arranged interleaved with respective fingers of the other IDT electrode of the second pair of IDT electrodes, the respective finger of the second pair of IDT electrodes separated by a second pitch distance from an adjacent finger, and a common reflector disposed between the first pair of IDT electrodes and the second pair of IDT electrodes, the common reflector including a plurality of fingers separated from each other by a third pitch distance, which is greater than the first pitch distance and is equal to or smaller than the second pitch distance.

In some embodiments, the acoustic wave device further comprises a pair of side reflectors arranged so as to interpose the first pair of IDT electrodes and the second pair of IDT electrodes therebetween.

In some embodiments, a size of the common reflector is smaller than the pair of side reflectors.

In some embodiments, the first pair of IDT electrodes is electrically connected to an input port and an output port, and the second pair of IDT electrodes is electrically connected to the input port and a ground such as to form a ladder type circuit.

In some embodiments, a wave frequency resonated by the first pair of IDT electrodes is higher than a wave frequency resonated by the second pair of IDT electrodes.

In some embodiments, the acoustic wave device further comprises a third pair of IDT electrodes disposed adjacent to one of the first pair of IDT electrodes and the second pair of IDT electrodes.

In some embodiments, the third pair of IDT electrodes is arranged adjacent to either the first pair of IDT electrodes or the second pair of IDT electrodes in line along a direction perpendicular to a direction of extension of the plurality of fingers of the first pair of IDT electrodes and the second pair of IDT electrodes.

In some embodiments, the common reflector and another side reflector is separated from each other, by a total width of the third pair of IDT electrodes and either the first pair of IDT electrodes or the second pair of IDT electrodes.

In some embodiments, the third pair of IDT electrodes is arranged adjacent to either the first pair of IDT electrode or the second pair of IDT electrodes in line along a direction of extension of the plurality of fingers of the first pair of IDT electrodes and second pair of IDT electrodes.

In some embodiments, a height in the extending direction of the common reflector is identical to a total height of the third pair of IDT electrodes and either the first pair of IDT electrodes or the second pair of IDT electrodes.

In accordance with another aspect, there is provided a radio frequency module. The radio frequency module comprises a packaging board configured to receive a plurality of components, and an acoustic wave device implemented on the packaging board, the acoustic wave device including a substrate, a first pair of IDT electrodes disposed on the substrate, each of the first pair of IDT electrodes including a bus bar and a plurality of fingers extending along a surface of the substrate from the bus bar, a respective finger of one IDT electrode arranged interleaved with respective fingers of the other IDT electrode of the first pair of IDT electrodes, the respective finger of the first pair of IDT electrodes separated by a first pitch distance from an adjacent finger, a second pair of IDT electrodes disposed on the substrate, each of the second pair of IDT electrodes including a bus bar and a plurality of fingers extending along the surface of the substrate from the bus bar, a respective finger of one IDT electrode arranged interleaved with respective fingers of the other IDT electrode of the second pair of IDT electrodes, the respective finger of the second pair of IDT electrodes separated by a second pitch distance from an adjacent finger, and a common reflector disposed between the first pair of IDT electrodes and the second pair of IDT electrodes, the common reflector including a plurality of fingers separated from each other by a third pitch distance, which is greater than the first pitch distance and is equal to or smaller than the second pitch distance.

In some embodiments, the radio frequency module is a front-end module.

In some embodiments, the radio frequency module further comprises a pair of side reflectors arranged so as to interpose the first pair of IDT electrodes and the second pair of IDT electrodes therebetween.

In some embodiments, a size of the common reflector is smaller than the pair of side reflectors.

In some embodiments, the first pair of IDT electrodes is electrically connected to an input port and an output port, and the second pair of IDT electrodes is electrically connected to the input port and a ground such to form a ladder type circuit.

In some embodiments, a wave frequency resonated by the first pair of IDT electrodes is higher than a wave frequency resonated by the second pair of IDT electrodes.

In some embodiments, the radio frequency module further comprises a third pair of IDT electrodes disposed adjacent to one of the first pair of IDT electrodes and the second pair of IDT electrodes.

In some embodiments, the third pair of IDT electrodes is arranged adjacent to either the first pair of IDT electrodes or the second pair of IDT electrodes in line along a direction perpendicular to a direction of extension of the plurality of fingers of the first pair of IDT electrodes and the second pair of IDT electrodes.

In some embodiments, the common reflector and another side reflector is separated from each other by a total width of the third pair of IDT electrodes and either the first pair of IDT electrodes or the second pair of IDT electrodes.

In some embodiments, the third pair of IDT electrodes is arranged adjacent to either the first pair of IDT electrode or the second pair of IDT electrodes in line along a direction of extension of the plurality of fingers of the first and second pairs of IDT electrodes.

In some embodiments, a height in the extending direction of the common reflector is identical to a total height of the third pair of IDT electrodes and either the first pair of IDT electrodes or the second pair of IDT electrodes.

In accordance with another aspect, there is provided a mobile device. The mobile device comprises an antenna configured to receive a radio frequency signal, and a front end system configured to communicate with the antenna, the front end system including an acoustic wave device that includes a first pair of IDT electrodes disposed on the substrate, each of the first pair of IDT electrodes including a bus bar and a plurality of fingers extending along a surface of the substrate from the bus bar, a respective finger of one IDT electrode arranged interleaved with respective fingers of the other IDT electrode of the first pair of IDT electrodes, the respective finger of the first pair of IDT electrodes separated by a first pitch distance from an adjacent finger, a second pair of IDT electrodes disposed on the substrate, each of the second pair of IDT electrodes including a bus bar and a plurality of fingers extending along the surface of the substrate from the bus bar, a respective finger of one IDT electrode arranged interleaved with respective fingers of the other IDT electrode of the second pair of IDT electrodes, the respective finger of the second pair of IDT electrodes separated by a second pitch distance from an adjacent finger, and a common reflector disposed between the first pair of IDT electrodes and the second pair of IDT electrodes, the common reflector including a plurality of fingers separated from each other by a third pitch distance, which is greater than the first pitch distance and is equal to or smaller than the second pitch distance.

In some embodiments, the mobile device further comprises a pair of side reflectors arranged so as to interpose the first pair of IDT electrodes and the second pair of IDT electrodes therebetween.

In some embodiments, a size of the common reflector is smaller than the pair of side reflectors.

In some embodiments, the first pair of IDT electrodes is electrically connected to an input port and an output port, and the second pair of IDT electrodes is electrically connected to the input port and a ground such to form a ladder type circuit.

In some embodiments, a wave frequency resonated by the first pair of IDT electrodes is higher than a wave frequency resonated by the second pair of IDT electrodes.

In some embodiments, the mobile device further comprises a third pair of IDT electrodes disposed adjacent to one of the first pair of IDT electrodes and the second pair of IDT electrodes.

In some embodiments, the third pair of IDT electrodes is arranged adjacent to either the first pair of IDT electrodes or the second pair of IDT electrodes in line along a direction perpendicular to a direction of extension of the plurality of fingers of the first pair of IDT electrodes and the second pair of IDT electrodes.

In some embodiments, the common reflector and another side reflector is separated from each other by a total width of the third pair of IDT electrodes and either the first pair of IDT electrodes or the second pair of IDT electrodes.

In some embodiments, the third pair of IDT electrodes is arranged adjacent to either the first pair of IDT electrode or the second pair of IDT electrodes in line along a direction of extension of the plurality of fingers of the first and second pairs of IDT electrodes.

In some embodiments, a height in the extending direction of the common reflector is identical to a total height of the third pair of IDT electrodes and either the first pair of IDT electrodes or the second pair of IDT electrodes.

DETAILED DESCRIPTION OF EMBODIMENTS

Figure 1:
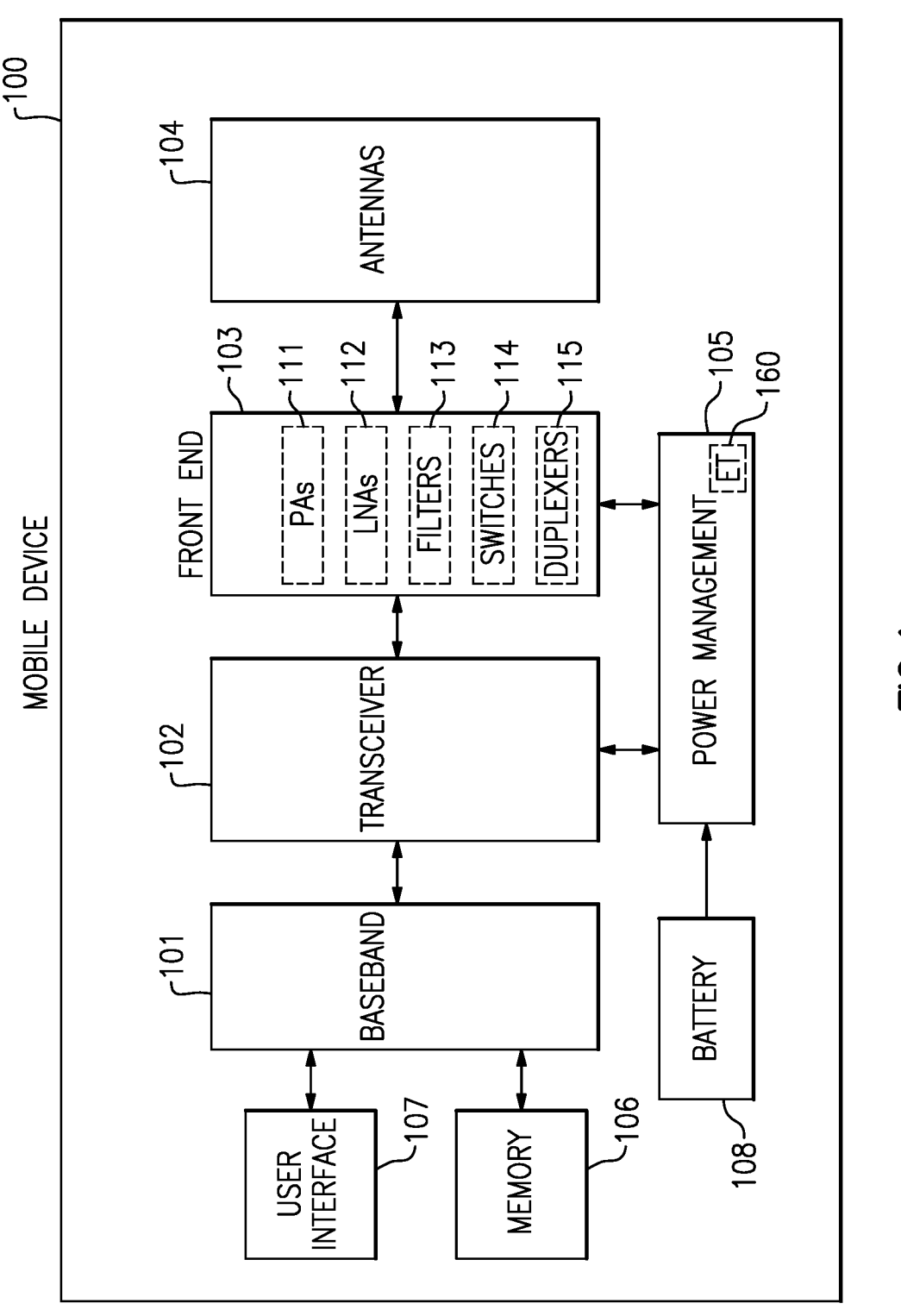
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 101, a transceiver 102, a front end system 103, antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the mobile device 100.

The memory 106 can be used for a wide variety of purposes, such as storing data and/or instructions to facilitate the operation of the mobile device 100 and/or to provide storage of user information.

The power management system 105 provides a number of power management functions of the mobile device 100. The power management system 105 of FIG. 1 includes an envelope tracker 160. As shown in FIG. 1, the power management system 105 receives a battery voltage form the battery 108. The battery 108 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figures 2A, 2B:
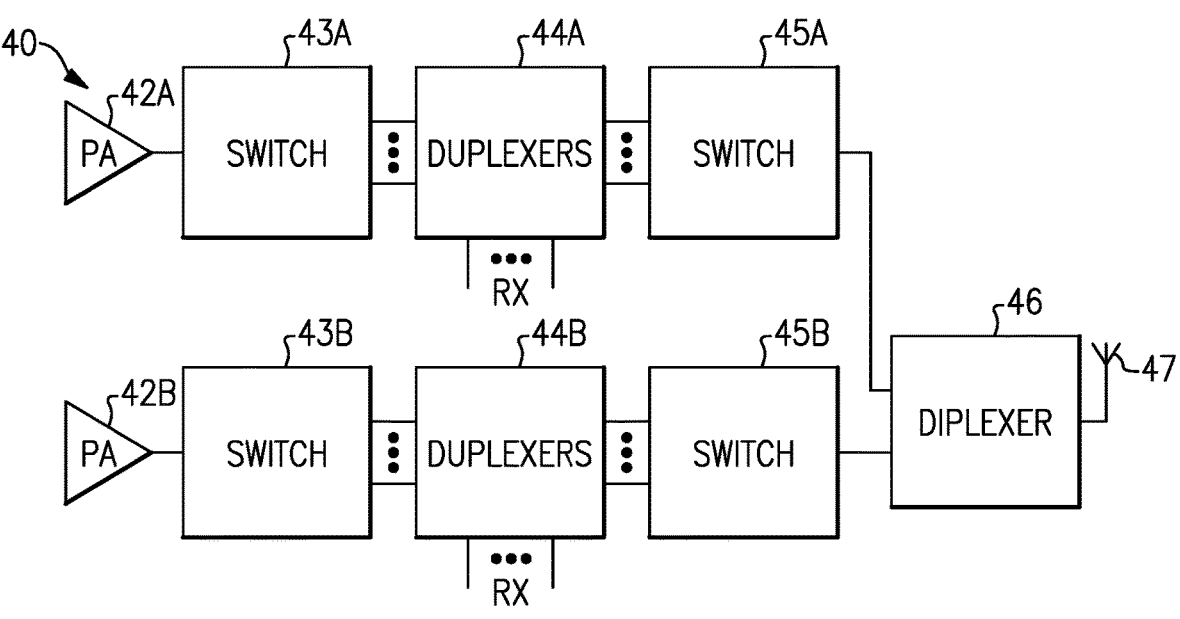
FIG. 2A is a schematic diagram of a carrier aggregation system.
FIG. 2B is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexer 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
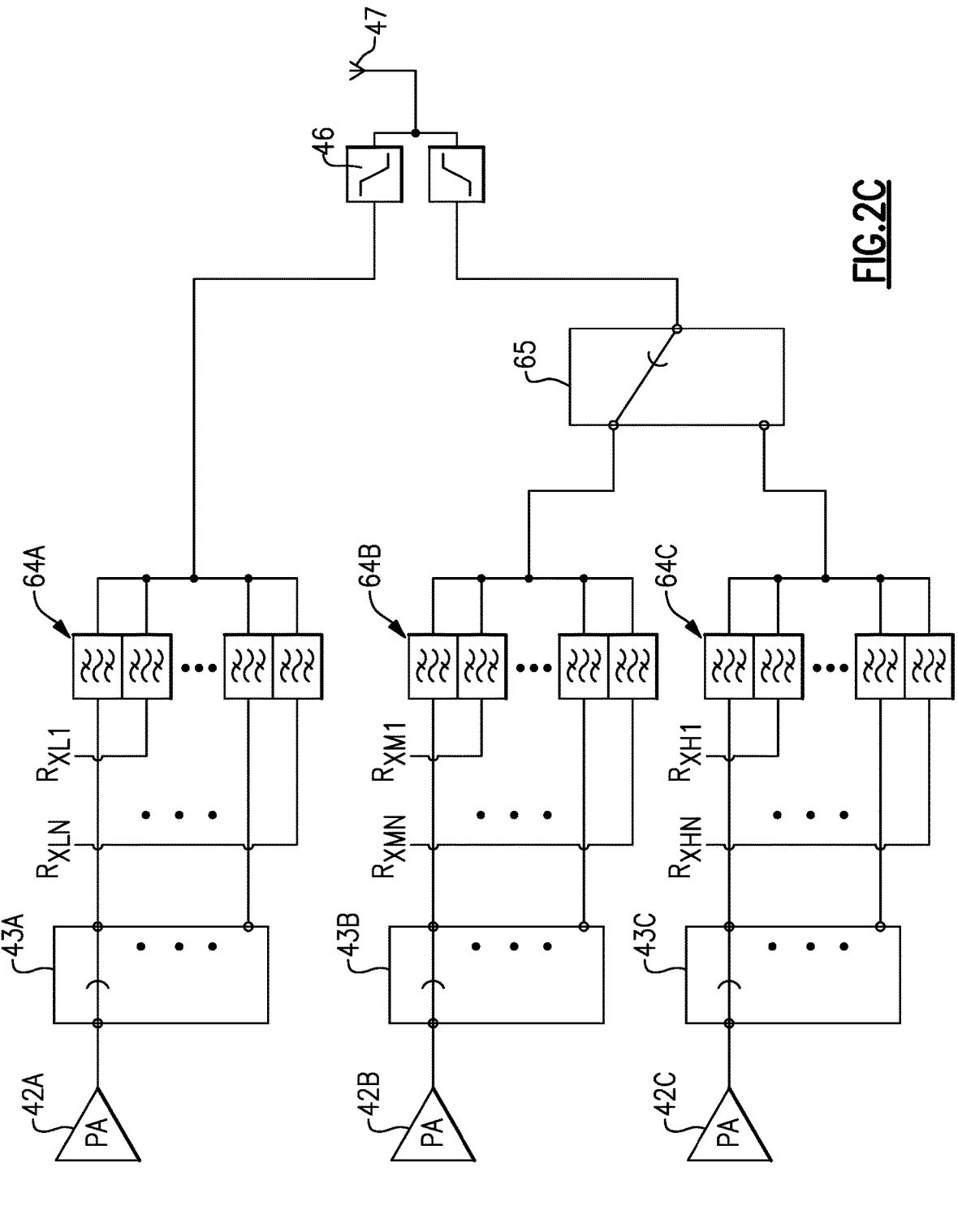
FIG. 2C is a schematic diagram of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A diplexer 46 can be included between the RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
FIG. 2D is a schematic diagram of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 44A and 44B are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A is coupled to a separate throw of the switch 75. Similarly, the illustrated duplexers 44B include a plurality of duplexers coupled to separate throws of the switch 75. Alternatively, instead of duplexers being coupled to each throw the switch 75 as illustrated in FIG. 2D, one or more individual filters of a multiplexer can be coupled to a dedicated throw of a switch coupled between the multiplexer and a common node. For instance, in some applications, such a switch could have twice as many throws as the illustrated switch 75.

Figure 3A:
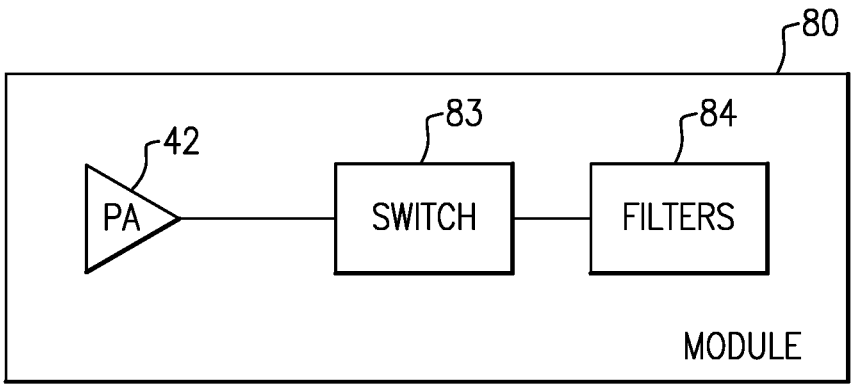
FIG. 3A is a schematic block diagram of a module that includes a filter.
Figure 3B:
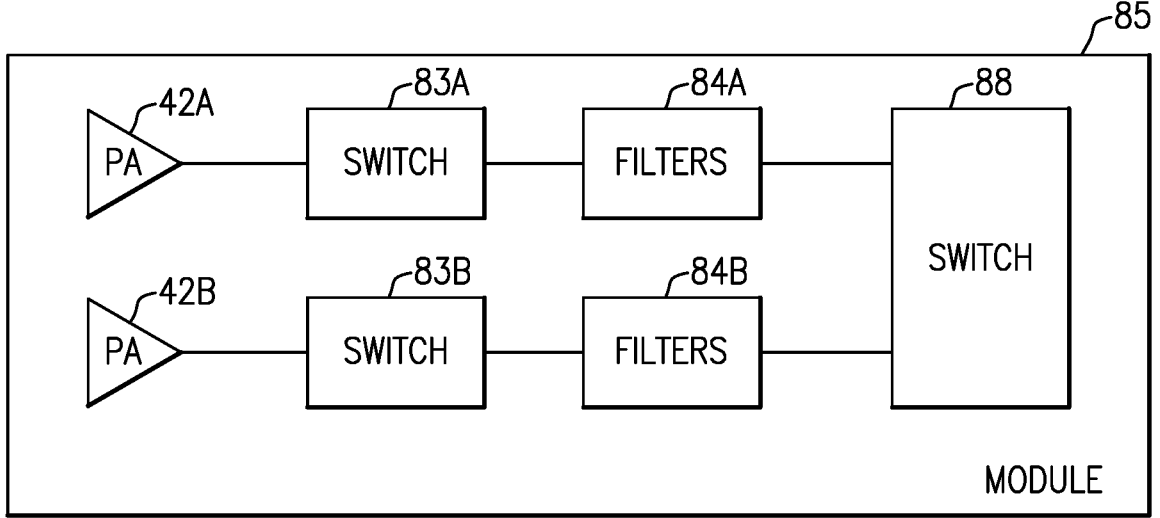
FIG. 3B is a schematic block diagram of a module that includes a filter.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 3A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

In recent years, in the field of information communication devices such as mobile phones, acoustic wave devices having a comb-shaped IDT electrode formed on a surface of a piezoelectric substrate are used as circuit elements such as resonators, filters, and the like.

Figure 4:
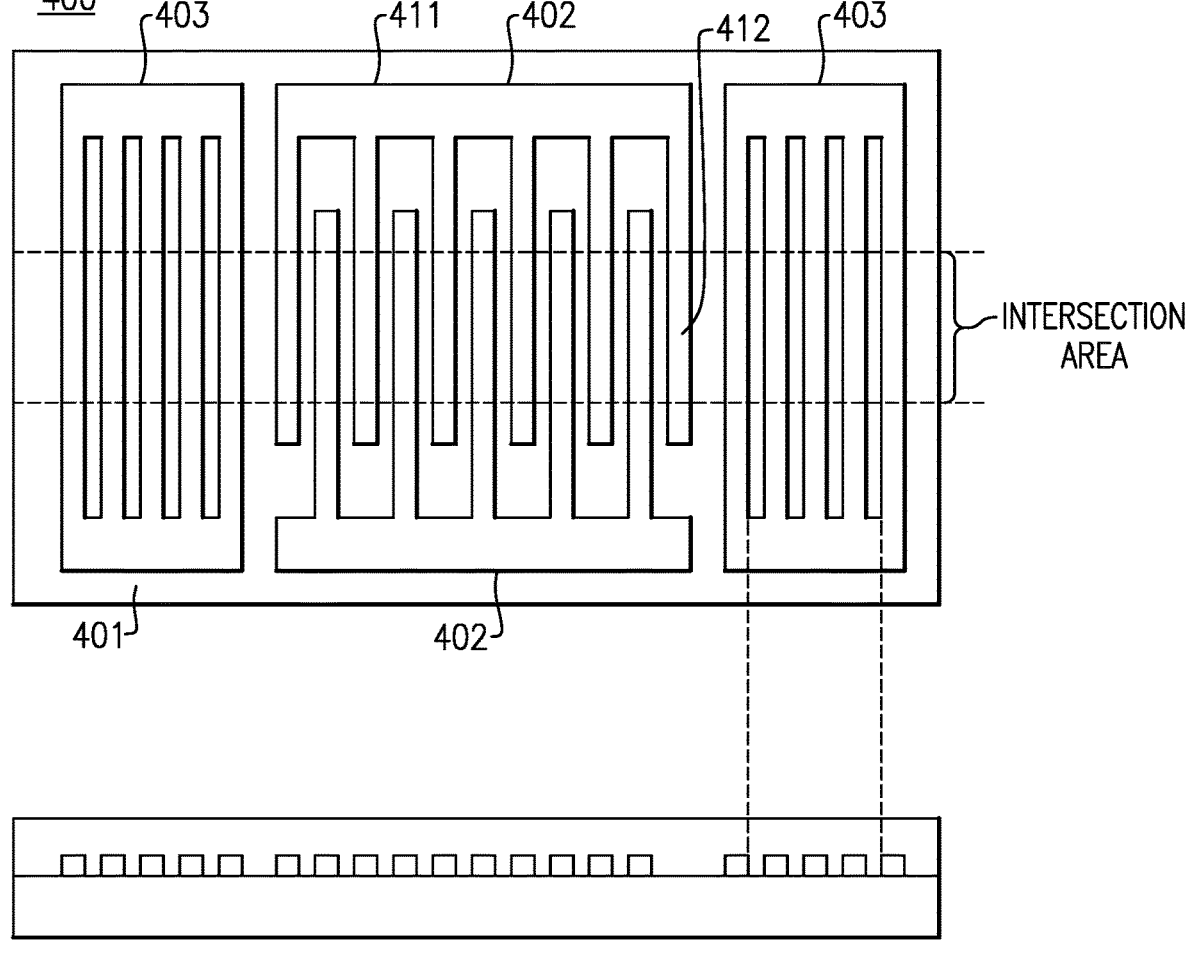
FIG. 4 is a schematic diagram of an example of an acoustic wave device.

FIG. 4 shows an example of such an acoustic wave device. In FIG. 4, a top view of an acoustic wave device 400 is shown. In this description, the acoustic wave device 400 can be also referred to as a resonator. The acoustic wave device 400 is formed by arranging two IDT electrodes 402 and two reflectors 403 on a piezoelectric substrate 401. The IDT electrodes 402 each have a bus bar 411 and a plurality of electrode fingers 412 that extends from the bus bar 411. The respective electrode fingers 412 of each of the IDT electrodes 402 are arranged such that the electrode fingers 412 thereof are arranged interleaved with the respective electrode fingers 412 of the other IDT electrode 402. The reflectors 403 are arranged so as to interpose the IDT electrodes 402 therebetween.

Figure 5:
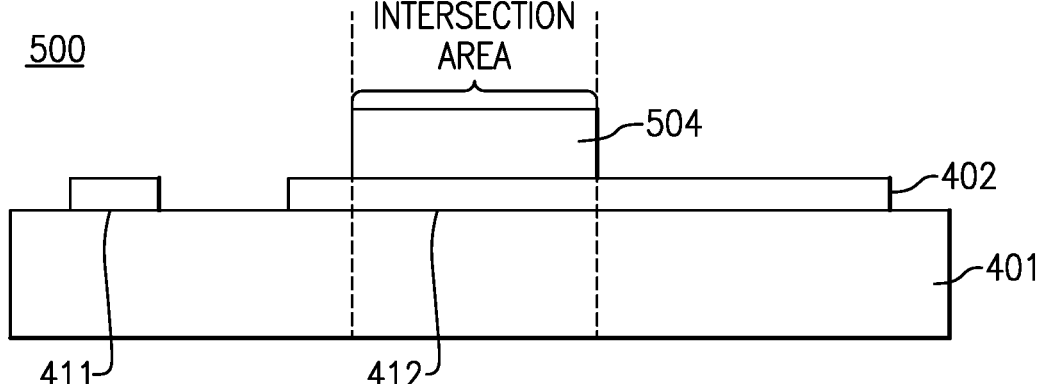
FIG. 5 is a sectional view of the acoustic wave device aligned along a single electrode finger.

FIG. 5 is a sectional view of the acoustic wave device 500 aligned along a single electrode finger 412. In the acoustic wave device 500, propagation of an acoustic wave is concentrated to the coating film 504, thereby suppressing a high-order transverse mode wave which is an unnecessary wave.

Figure 6:
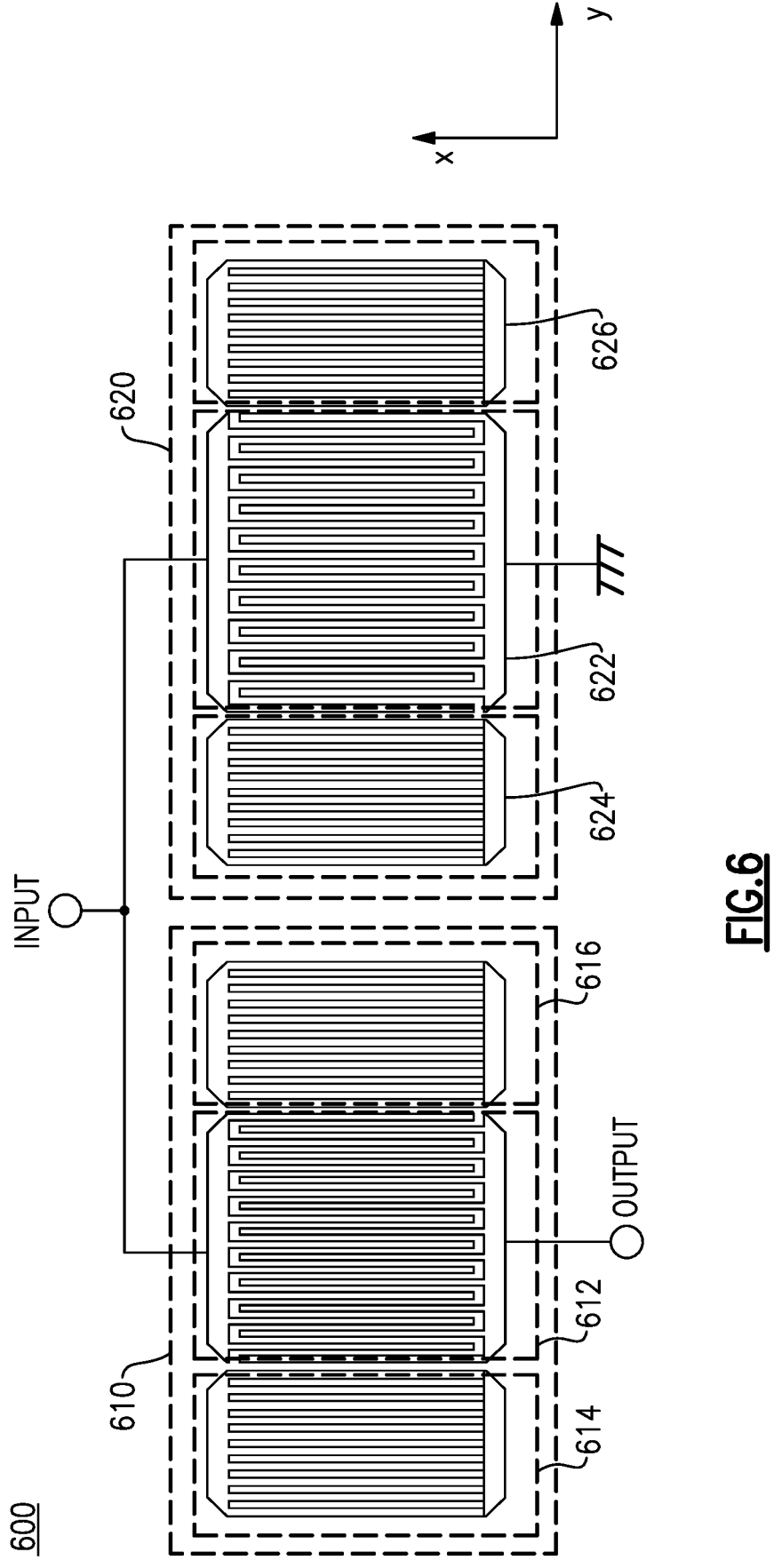
FIG. 6 is a schematic of resonators implemented according to an example of a conventional manner.

FIG. 6 is a schematic of resonators 600 implemented according to an example of a conventional manner. The resonators 600 in this example may have a ladder structure. The resonators 600 may include a first resonator 610 and a second resonator 620. The first resonator 610 may be disposed between the input port and the output port, and the second resonator 620 may be disposed between the input port and a ground.

The first resonator 610 may include a pair of IDT electrodes 612, and reflectors 614, 616 arranged so as to interpose the pair of IDT electrodes 612 therebetween. Thus, the reflectors 614, 616 may be disposed on each side of the pair of IDT electrodes 612, respectively. In FIG. 6, the reflector 614, the pair of IDT electrodes 612, and the reflector 616 are arranged along the y direction.

The second resonator 620 may include a pair of IDT electrodes 622, and reflectors 624, 626 arranged so as to interpose the pair of IDT electrodes 622 therebetween. Thus, the reflectors 624, 626 may be disposed on each side of the pair of IDT electrodes 622, respectively. In FIG. 6, the reflector 624, the pair of IDT electrodes 622, and the reflector 626 are arranged along the y direction.

Each of the pair of IDT electrodes 612, 622 may include a bus bar and a plurality of fingers extending from the bus bar, a respective finger of one IDT electrode arranged interleaved with respective fingers of the other IDT electrode.

In this example, since each of the first resonator 610 and the second resonator 620 has two reflectors, respectively, plenty of room is required to implement this structure.

Figure 7:
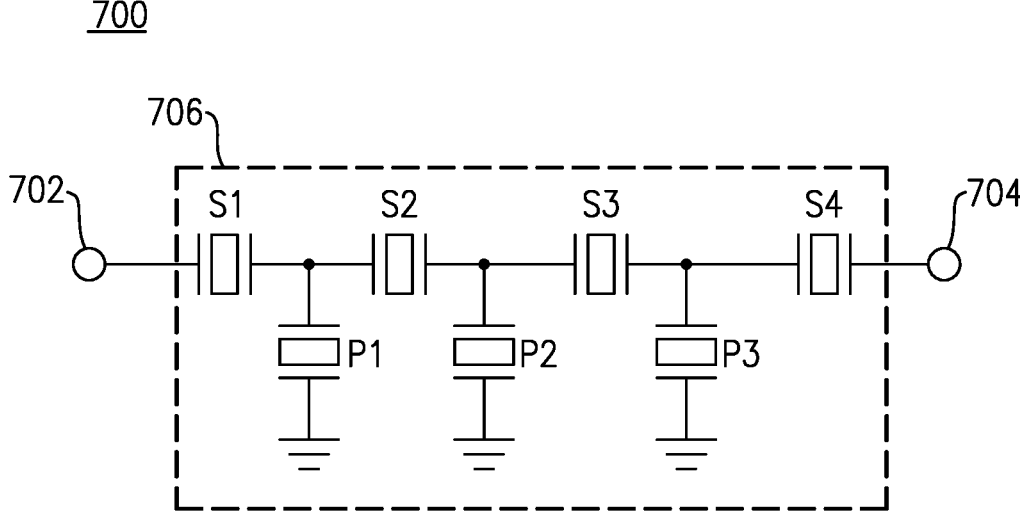
FIG. 7 is a schematic diagram of a filter module.

FIG. 7 is a schematic diagram of a filter module. The filter module 700 shown in FIG. 7 may be an example that a resonator according to an embodiment of the present disclosure can be applied. In this example, the filter module 700 may be a ladder type filer. The filter module may include a first terminal 702, a second terminal 704, and a filter 706.

The first terminal 702 may be configured to receive a radio frequency (RF) signal. The second terminal 704 may be configured to output filtered RF signal. The second terminal 704 may be configured to be connected to an antenna. However, while the terms are defined for the purpose of clear distinction, the numbering of the first terminal 702 and the second terminal 704 may be also switched with respect to each other.

The filter 706 is disposed along each signal path extending from the first terminal 702 to the second terminal 704. The filter 706 may include a plurality of series resonators S1-S4 and a plurality of shunt resonators P1-P3 disposed between the series resonators S1-S4 and a ground.

Hereinafter, an acoustic wave device according to an embodiment of the present disclosure is provided. According to an embodiment, the acoustic wave device may be a dual resonator with a structure in which two resonators share one reflector, and therefore the total area of the reflector may be smaller than 75% compared to the conventional manner.

Figure 8:
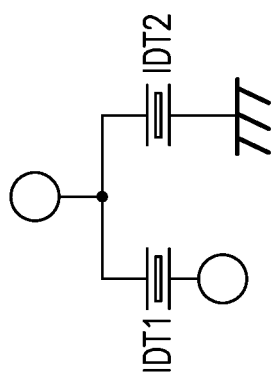
FIG. 8 is a schematic diagram of an example of an acoustic wave device according to an embodiment of the present disclosure.

FIG. 8 is a schematic diagram of an example of acoustic wave device 800 according to an embodiment of the present disclosure. As shown in FIG. 8, the acoustic wave device 800 may include a substrate 802, a first pair of IDT electrodes 804, a second pair of IDT electrodes 806, and a common reflector 808. Each of the first and second pairs of IDT electrodes 804, 806 may be resonators (for example, S3 and P3) described in FIG. 7.

The substrate 802 may be a panel where the first pair of IDT electrodes 804 and second pair of IDT electrodes 806 and the common reflector 808 can be disposed. The substrate 802 may be formed of lithium niobate ($LiNbO_3$).

The first pair of IDT electrodes 804 may be disposed on the substrate 802. Each of the first pair of IDT electrodes 804 may include a bus bar and a plurality of fingers extending along a surface of the substrate 802 from the bus bar. The bus bar and the plurality of fingers may be implemented with reference to the description of FIG. 4. In this embodiment, the plurality of fingers of the first pair of IDT electrodes 804 may extend in the ±x direction. The direction of extension of each finger may be perpendicular to a main wave propagation direction that is the y direction in FIG. 8.

The respective fingers of one IDT electrode may be arranged interleaved with respective fingers of the other IDT electrode of the first pair of IDT electrodes 804. Each finger of the first pair of IDT electrodes 804 may be interleaved with respective fingers to have a gap of a first pitch distance. In other words, each of the respective finger of one IDT electrode may be remote from adjacent fingers of another IDT electrode by the first pitch distance. The pitch distance may be a gap between an adjacent fingers of each IDT electrodes that is constant throughout the pair of IDT electrodes.

According to an embodiment, the first pair of IDT electrodes 804 may be disposed between an input port (INPUT) and an output port (OUTPUT). More specifically, one IDT electrode may be electrically connected to the input port, and another IDT electrode may be electrically connected to the output port. In this example, the first pair of IDT electrodes 804 may be a series resonator (S1, S2, S3 or S4) that is shown in FIG. 7.

The second pair of IDT electrodes 806 may be disposed on the substrate 802. Each of the second pair of IDT electrodes 806 may include a bus bar and a plurality of fingers extending along a surface of the substrate 802 from the bus bar. The bus bar and the plurality of fingers may be implemented with reference to the description of FIG. 4. In this embodiment, the plurality of fingers of the second pair of IDT electrodes 806 may extend in the ±x direction.

The respective fingers of one IDT electrode may be arranged interleaved with respective fingers of the other IDT electrode of the second pair of IDT electrodes 806. Each finger of the second pair of IDT electrodes 806 may be interleaved with respective fingers to have a gap of a second pitch distance. In other words, each of the respective finger of one IDT electrode may be separated from adjacent fingers of another IDT electrode by the second pitch distance. The pitch distance may be a gap between an adjacent fingers of each IDT electrodes that is constant throughout the pair of IDT electrodes.

According to an embodiment, the second pair of IDT electrodes 806 may be disposed between the input port (INPUT) and a ground (GND). More specifically, one IDT electrode of the second pair of IDT electrodes 806 may be electrically connected to the input port, and another IDT electrode may be electrically connected to the ground. In this example, the second pair of IDT electrodes 806 may be a shunt resonator (P1, P2, or P3) that is shown in FIG. 7. Therefore, the first pair of IDT electrodes 804 and the second pair of IDT electrodes 806 may constitute a ladder type circuit.

According to an embodiment, the first pair of IDT electrodes 804 may have higher resonance wave frequency than the second pair of IDT electrodes 806. That is, a wave frequency resonated by the first pair of IDT electrodes 804 may be higher than a wave frequency resonated by the second pair of IDT electrodes 806.

The common reflector 808 may be disposed between the first pair of IDT electrodes 804 and the second pair of IDT electrodes 806. That is, the common reflector 808 may be shared by the first pair of IDT electrodes 804 and the second pair of IDT electrodes 806. Therefore, the number of reflectors required for the acoustic wave device 800 can be reduced.

The common reflector 808 may include a plurality of fingers separated from each other by a third pitch distance. The fingers of the common reflector may extend in the ±x direction in FIG. 8. The third pitch may be greater than the first pitch distance and equal to or smaller than the second pitch distance.

The acoustic wave device 800 may further include a pair of side reflectors 810, 820. The pair of side reflectors 810, 820 may be arranged so as to interpose the first pair of IDT electrodes 804. Each of the pair of side reflectors 810, 820 may have a plurality of fingers that extend in the ±x direction as well.

The lengths in the ±x direction of the pair of IDT electrodes 804, the second pair of IDT electrodes 806, the common reflector 808, and the pair of side reflector 810, 820 may be identical.

According to embodiments, the number of reflectors required for a dual resonator can be reduced by using a common reflector 808, and the size of the common reflector 808 can be made even smaller than side reflectors 810, 820 by adjusting the pitch distance of the common reflector 808. In addition, each resonator also may act as a reflector for the other resonator, and the leaked energy is also recovered by each resonator, so Q is high.

Figure 9:
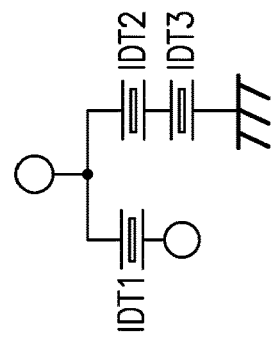
FIG. 9 is a schematic diagram of an extended example of an acoustic wave device.
Figure 9:
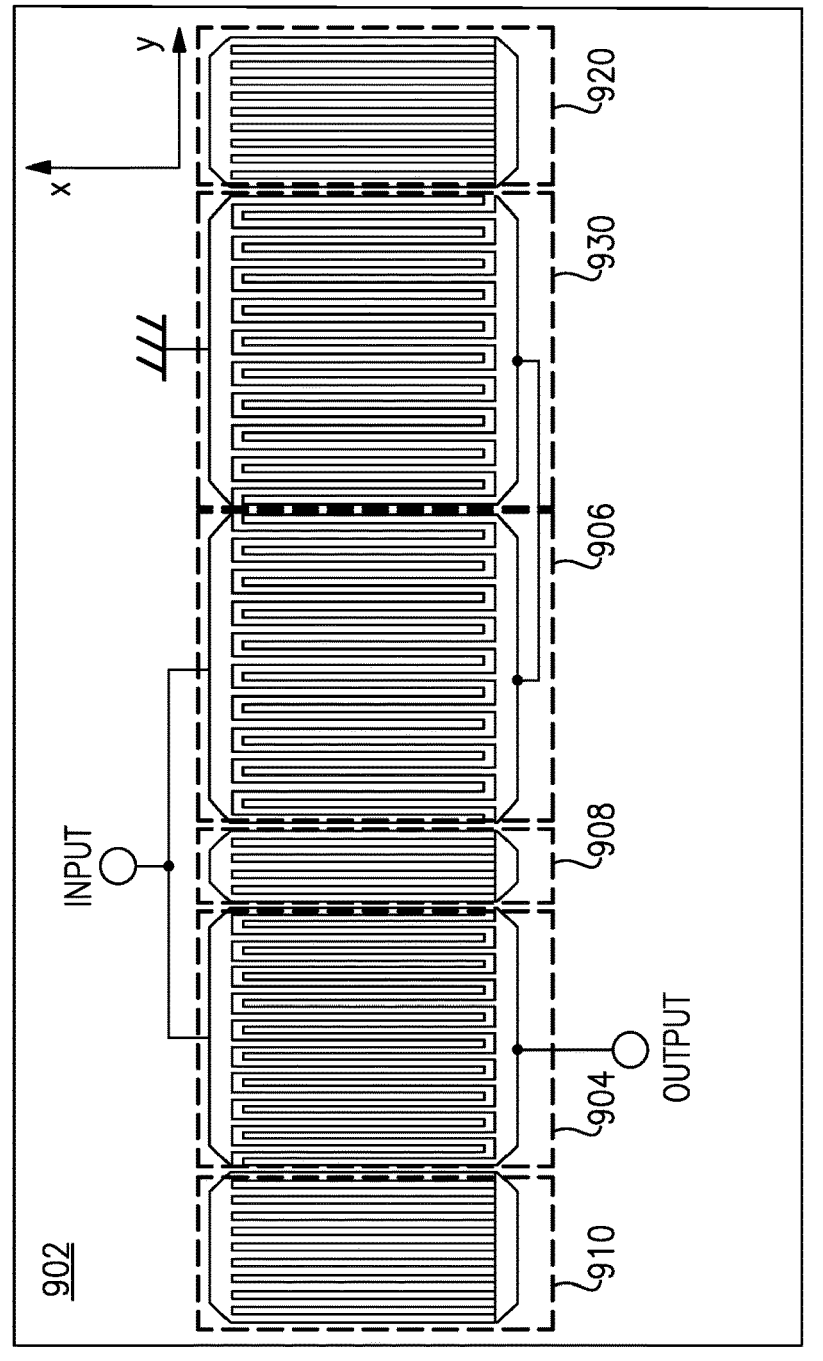

FIG. 9 is a schematic diagram of an extended example of an acoustic wave device 900. As shown in FIG. 9, the acoustic wave device 900 may further include a third pair of IDT electrodes 930. Apart from the added third pair of IDT electrodes 930, other elements of the acoustic wave device 800 described with reference to FIG. 8 can be applied hereto.

For example, the acoustic wave device 900 may include a substrate 902, a first pair of IDT electrodes 904, and a second pair of IDT electrodes 906, a common reflector 908, and a pair of side reflectors 910, 920.

The third pair of IDT electrodes 930 may be arranged adjacent to either the first pair of IDT electrodes 904 or the second pair of IDT electrodes 906 in line along a direction perpendicular to an extending direction of the plurality of fingers of the first pair of IDT electrodes 904 and the second pair of IDT electrodes 906. That is, the third pair of IDT electrodes 930 may be disposed next to the first or second pair of electrodes in the ±y direction. According to an embodiment, the common reflector 908 and another side reflector 920 or 930 is separated from each other by a total width of the third IDT electrodes 930 and either the first pair of IDT electrodes 904 or the second pair of IDT electrodes 906.

In view of electronic circuit diagram, the third pair of IDT electrodes 930 (IDT3) may constitute a series connection with either the first IDT electrodes 904 (IDT1) or the second IDT electrodes 906 (IDT2) as shown in FIG. 9.

Although FIG. 9 shows the third pair of IDT electrodes 930 disposed adjacent to the second pair of IDT electrodes 906, the third pair of IDT electrodes 930 may also be disposed adjacent to the first IDT electrodes 904.

Figure 10:
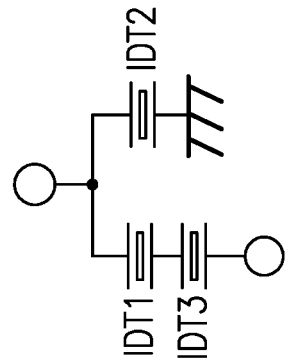
FIG. 10 is a schematic diagram of an extended example of an acoustic wave device.
Figure 10:
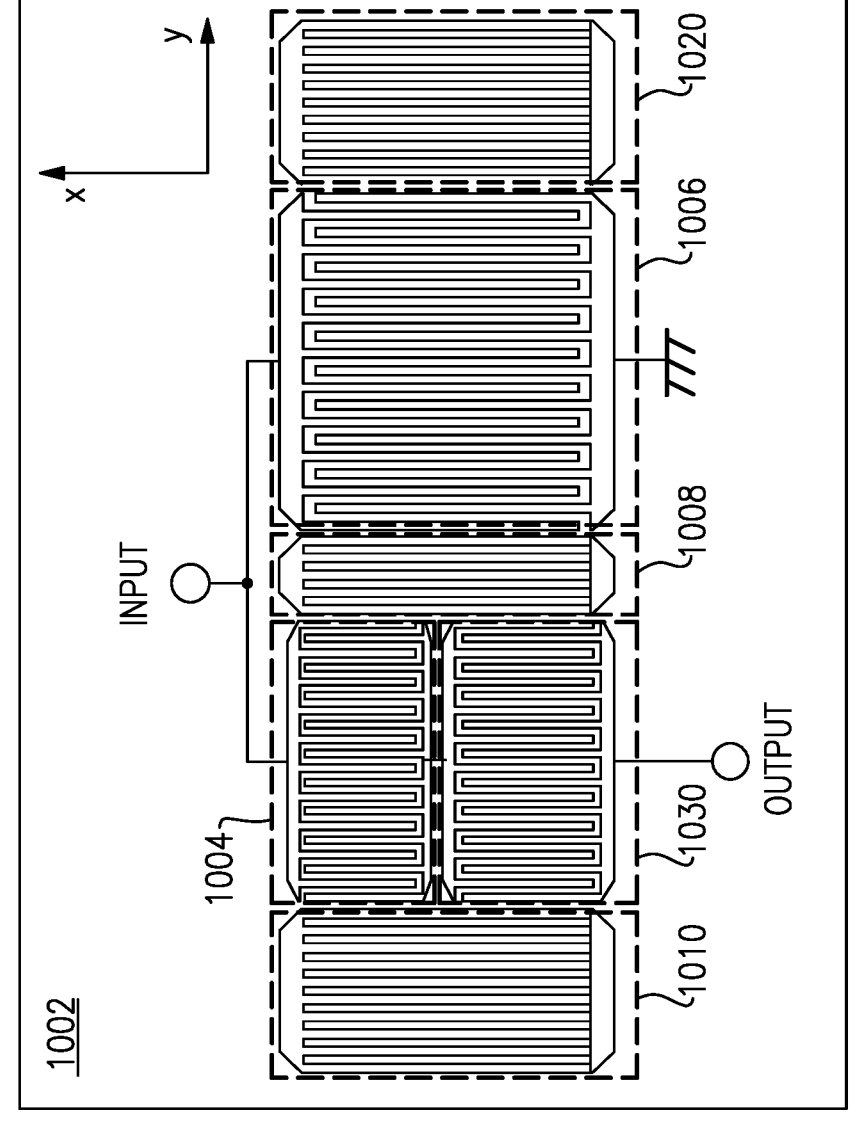

FIG. 10 is a schematic diagram of an extended example of an acoustic wave device 1000. As shown in FIG. 10, the acoustic wave device 1000 may further include a third pair of IDT electrodes 1030. Apart from the added third pair of IDT electrodes 1030, other elements of the acoustic wave device 800 described with reference to FIG. 8 can be applied hereto.

For example, the acoustic wave device 1000 may include a substrate 1002, a first pair of IDT electrodes 1004, and a second pair of IDT electrodes 1006, a common reflector 1008, and a pair of side reflectors 1010, 1020.

The third pair of IDT electrodes 1030 may be arranged adjacent to either the first pair of IDT electrodes 1004 or the second pair of IDT electrodes 1006 in line along an extending direction of the plurality of fingers of the first pair of IDT electrodes 1004 and the second pair of IDT electrodes 1006. That is, the third pair of IDT electrodes 1030 may be disposed next to the first pair of IDT electrodes 1004 or the second pair of IDT electrodes 1006 in the ±x direction. According to an embodiment, a height (in the ±y direction) of the common reflector 1008 is identical to a total height of the third pair of IDT electrodes 1030 and either the first pair of IDT electrodes 1004 or the second pair of IDT electrodes 1006.

In view of electronic circuit diagram, the third pair of IDT electrodes 1030 (IDT3) may constitute a series connection with either the first IDT electrodes 1004 (IDT1) or the second IDT electrodes 1006 (IDT2) as shown in FIG. 10.

Although FIG. 10 shows the third pair of IDT electrodes 1030 that is disposed adjacent to the first pair of IDT electrodes 1004, the third pair of IDT electrodes 1030 may also be disposed adjacent to the second pair of IDT electrodes 1006.

Figures 11A, 11B:
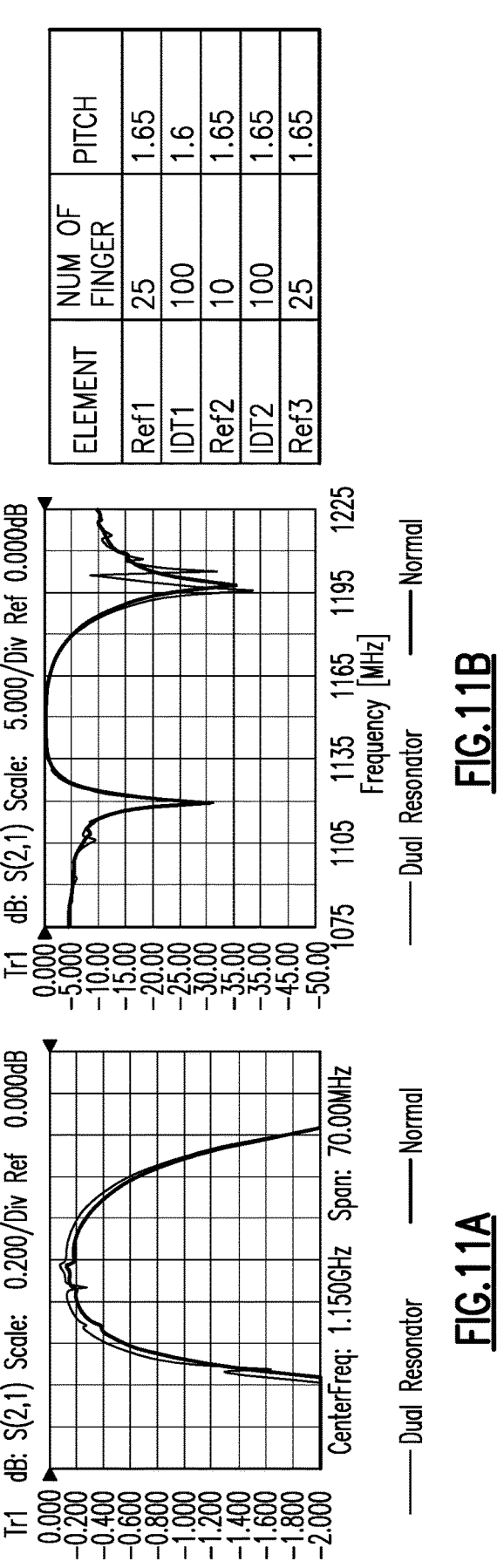
FIG. 11A shows a frequency characteristic of the acoustic wave device.
FIG. 11B shows a frequency characteristic of the acoustic wave device in a different scale of frequency.

FIG. 11A shows a frequency characteristic of the acoustic wave device. FIG. 11B shows a frequency characteristic of the acoustic wave device in different scale of frequency. In this example, the acoustic wave device may be used to implement a band-pass filter.

As shown in FIGS. 11A and 11B, the frequency characteristic of dual resonator according to an embodiment of the present disclosure is improved compared to that of normal acoustic wave device with separate reflector in the middle.

Figure 12B:
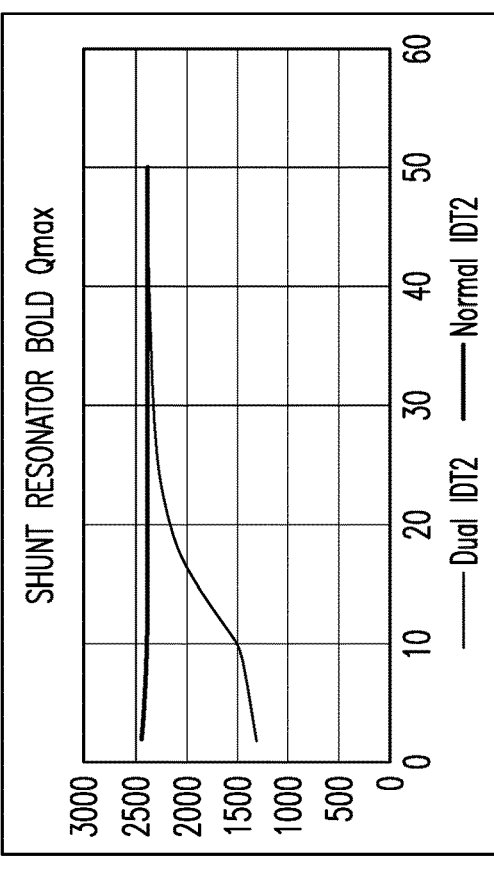
FIG. 12B shows a quality factor of the second pair of IDT electrodes of the acoustic wave device.
Figure 12A:
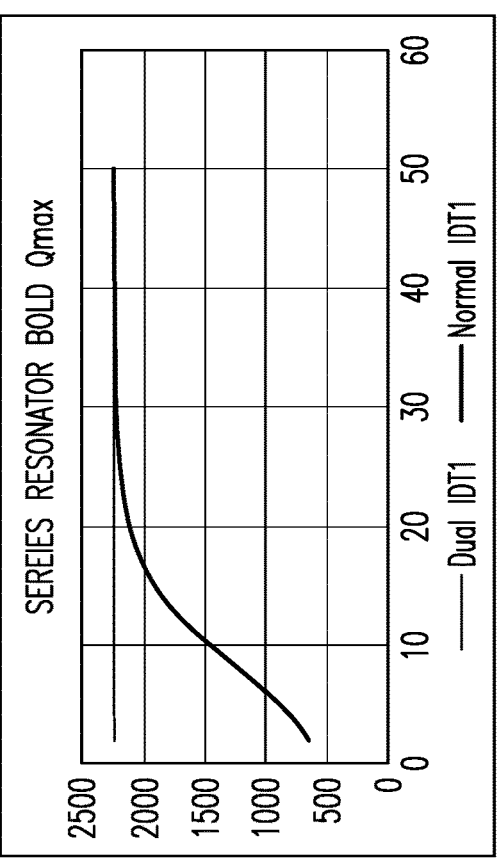
FIG. 12A shows a quality factor of the first pair of IDT electrodes of the acoustic wave device.

FIG. 12A shows a quality factor of the first pair of IDT electrodes of the acoustic wave device. FIG. 12B shows a quality factor of the second pair of IDT electrodes of the acoustic wave device. In this example, the first pair of IDT electrodes may be a series resonator and the second pair of IDT electrodes may be a shunt resonator.

As shown in FIGS. 12A and 12B, the Q factor of the first pair of IDT electrodes and the second pair of IDT electrodes are improved compared to that of first pair of IDT electrodes and second pair of IDT electrodes according to the normal acoustic wave device.

Figure 13A:
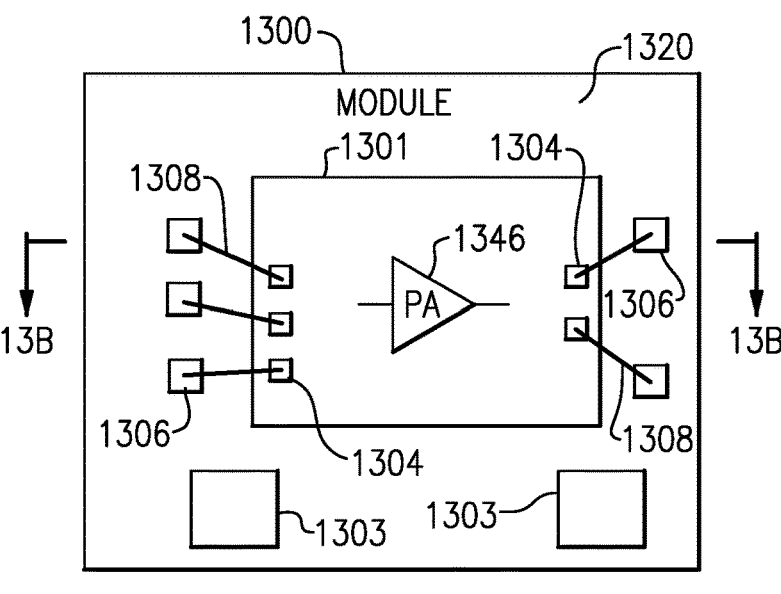
FIG. 13A is a schematic diagram of one embodiment of a packaged module.
Figure 13B:
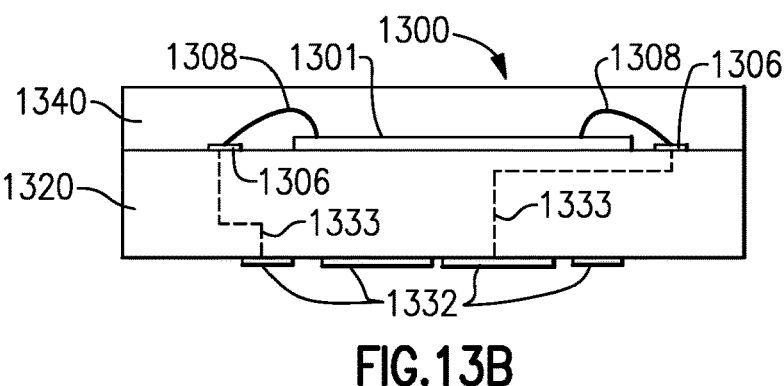
FIG. 13B is a schematic diagram of a cross-section of the packaged module of FIG. 13A taken along the lines 13B-13B.

FIG. 13A is a schematic diagram of one embodiment of a packaged module 1300. FIG. 13B is a schematic diagram of a cross-section of the packaged module 1300 of FIG. 13A taken along the lines 13A-13B.

The packaged module 1300 includes an IC or die 1301, surface mount components 1303, wirebonds 1308, a package substrate 1320, and encapsulation structure 1340. The package substrate 1320 includes pads 1306 formed from conductors disposed therein. Additionally, the die 1301 includes pads 1304, and the wirebonds 1308 have been used to electrically connect the pads 1304 of the die 1301 to the pads 1306 of the package substrate 1320.

The die 1301 includes a filter module, which can be implemented in accordance with any of the embodiments herein.

The packaging substrate 1320 can be configured to receive a plurality of components such as the die 1301 and the surface mount components 1303, which can include, for example, surface mount capacitors and/or inductors.

As shown in FIG. 13B, the packaged module 1300 is shown to include a plurality of contact pads 1332 disposed on the side of the packaged module 1300 opposite the side used to mount the die 1301. Configuring the packaged module 1300 in this manner can aid in connecting the packaged module 1300 to a circuit board such as a phone board of a wireless device. The example contact pads 1332 can be configured to provide RF signals, bias signals, power low voltage(s) and/or power high voltage(s) to the die 1301 and/or the surface mount components 1303. As shown in FIG. 13B, the electrically connections between the contact pads 1332 and the die 1301 can be facilitated by connections 1333 through the package substrate 1320. The connections 1333 can represent electrical paths formed through the package substrate 1320, such as connections associated with vias and conductors of a multilayer laminated package substrate.

In some embodiments, the packaged module 1300 can also include one or more packaging structures to, for example, provide protection and/or facilitate handling of the packaged module 1300. Such a packaging structure can include overmold or encapsulation structure 1340 formed over the packaging substrate 1320 and the components and die(s) disposed thereon.

It will be understood that although the packaged module 1300 is described in the context of electrical connections based on wirebonds, one or more features of the present disclosure can also be implemented in other packaging configurations, including, for example, flip-chip configurations.

Figure 14:
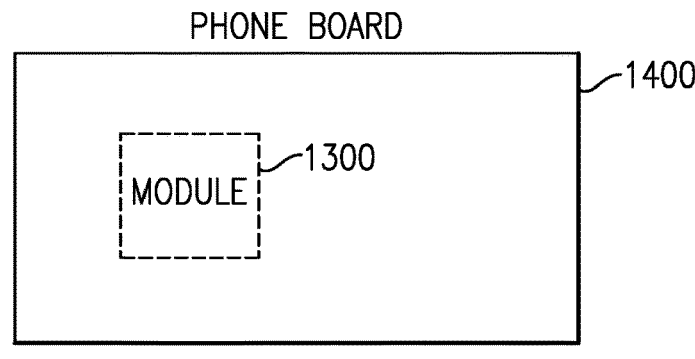
FIG. 14 is a schematic diagram of one embodiment of a phone board.

FIG. 14 is a schematic diagram of one embodiment of a phone board 1400. The phone board 1400 includes the module 1300 shown in FIGS. 13A-13B attached thereto.

Although not illustrated in FIG. 14 for clarity, the phone board 1400 can include additional components and structures.

Applications

Some of the embodiments described above have provided examples in connection with wireless devices or mobile phones. However, the principles and advantages of the embodiments can be used for any other systems or apparatus that have needs for power amplifiers.

Such acoustic wave devices can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An acoustic wave device comprising:
a substrate;
a first pair of IDT electrodes disposed on the substrate, each of the first pair of IDT electrodes including a bus bar and a plurality of fingers extending along a surface of the substrate from the bus bar, a respective finger of one IDT electrode arranged interleaved with respective fingers of the other IDT electrode of the first pair of IDT electrodes, the respective finger of the first pair of IDT electrodes separated by a first pitch distance from an adjacent finger;
a second pair of IDT electrodes disposed on the substrate, each of the second pair of IDT electrodes including a bus bar and a plurality of fingers extending along the surface of the substrate from the bus bar, a respective finger of one IDT electrode arranged interleaved with respective fingers of the other IDT electrode of the second pair of IDT electrodes, the respective finger of the second pair of IDT electrodes separated by a second pitch distance from an adjacent finger;
a third pair of IDT electrodes disposed adjacent to one of the first pair of IDT electrodes and the second pair of IDT electrodes in line along a direction of extension of the plurality of fingers of the first pair of IDT electrodes and second pair of IDT electrodes; and
a common reflector disposed between the first pair of IDT electrodes and the second pair of IDT electrodes, the common reflector including a plurality of fingers separated from each other by a third pitch distance, which is greater than the first pitch distance and is equal to or smaller than the second pitch distance.

2. The acoustic wave device of claim 1 further comprising a pair of side reflectors arranged so as to interpose the first pair of IDT electrodes and the second pair of IDT electrodes therebetween, a size of the common reflector being smaller than the pair of side reflectors.

3. The acoustic wave device of claim 1 wherein the first pair of IDT electrodes is electrically connected to an input port and an output port, and the second pair of IDT electrodes is electrically connected to the input port and a ground such as to form a ladder type circuit.

4. The acoustic wave device of claim 1 wherein a wave frequency resonated by the first pair of IDT electrodes is higher than a wave frequency resonated by the second pair of IDT electrodes.

5. The acoustic wave device of claim 1 wherein a height in the extending direction of the common reflector is identical to a total height of the third pair of IDT electrodes and either the first pair of IDT electrodes or the second pair of IDT electrodes.

6. A radio frequency module comprising:

a packaging board configured to receive a plurality of components; and an acoustic wave device implemented on the packaging board, the acoustic wave device including a substrate, a first pair of IDT electrodes disposed on the substrate, each of the first pair of IDT electrodes including a bus bar and a plurality of fingers extending along a surface of the substrate from the bus bar, a respective finger of one IDT electrode arranged interleaved with respective fingers of the other IDT electrode of the first pair of IDT electrodes, the respective finger of the first pair of IDT electrodes separated by a first pitch distance from an adjacent finger, a second pair of IDT electrodes disposed on the substrate, each of the second pair of IDT electrodes including a bus bar and a plurality of fingers extending along the surface of the substrate from the bus bar, a respective finger of one IDT electrode arranged interleaved with respective fingers of the other IDT electrode of the second pair of IDT electrodes, the respective finger of the second pair of IDT electrodes separated by a second pitch distance from an adjacent finger, a common reflector disposed between the first pair of IDT electrodes and the second pair of IDT electrodes, the common reflector including a plurality of fingers separated from each other by a third pitch distance, which is greater than the first pitch distance and is equal to or smaller than the second pitch distance, and a third pair of IDT electrodes disposed adjacent to one of the first pair of IDT electrodes and the second pair of IDT electrodes in line along a direction of extension of the plurality of fingers of the first and second pairs of IDT electrodes, a height in the extending direction of the common reflector being identical to a total height of the third pair of IDT electrodes and either the first pair of IDT electrodes or the second pair of IDT electrodes.

7. The radio frequency module of claim 6 wherein the radio frequency module is a front-end module.

8. The radio frequency module of claim 6 wherein the first pair of IDT electrodes is electrically connected to an input port and an output port, and the second pair of IDT electrodes is electrically connected to the input port and a ground such to form a ladder type circuit.

9. A mobile device comprising:

an antenna configured to receive a radio frequency signal; and a front end system configured to communicate with the antenna, the front end system including an acoustic wave device that includes a first pair of IDT electrodes disposed on a substrate, each of the first pair of IDT electrodes including a bus bar and a plurality of fingers extending along a surface of the substrate from the bus bar, a respective finger of one IDT electrode arranged interleaved with respective fingers of the other IDT electrode of the first pair of IDT electrodes, the respective finger of the first pair of IDT electrodes separated by a first pitch distance from an adjacent finger, a second pair of IDT electrodes disposed on the substrate, each of the second pair of IDT electrodes including a bus bar and a plurality of fingers extending along the surface of the substrate from the bus bar, a respective finger of one IDT electrode arranged interleaved with respective fingers of the other IDT electrode of the second pair of IDT electrodes, the respective finger of the second pair of IDT electrodes separated by a second pitch distance from an adjacent finger, a common reflector disposed between the first pair of IDT electrodes and the second pair of IDT electrodes, the common reflector including a plurality of fingers separated from each other by a third pitch distance, which is greater than the first pitch distance and is equal to or smaller than the second pitch distance, and a third pair of IDT electrodes disposed adjacent to one of the first pair of IDT electrodes and the second pair of IDT electrodes in line along a direction of extension of the plurality of fingers of the first and second pairs of IDT electrodes, a height in the extending direction of the common reflector being identical to a total height of the third pair of IDT electrodes and either the first pair of IDT electrodes or the second pair of IDT electrodes.

\* \* \* \* \*